United States Patent
Oh et al.

(10) Patent No.: US 11,723,240 B2
(45) Date of Patent: Aug. 8, 2023

(54) DISPLAY PANEL, METHOD OF MANUFACTURING THE SAME, AND DISPLAY DEVICE HAVING THE DISPLAY PANEL

(71) Applicant: Samsung Display Co., Ltd., Yongin-Si (KR)

(72) Inventors: Eon Seok Oh, Seongnam-si (KR); Woosik Jeon, Hwaseong-si (KR); Jungmin Choi, Hwaseong-si (KR); Junkyeong Jeong, Hwaseong-si (KR); Seungsoo Hong, Bucheon-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 186 days.

(21) Appl. No.: 17/148,444

(22) Filed: Jan. 13, 2021

(65) Prior Publication Data
US 2021/0305343 A1    Sep. 30, 2021

(30) Foreign Application Priority Data

Mar. 27, 2020 (KR) .......................... 10-2020-0037822

(51) Int. Cl.
*H01L 27/32* (2006.01)
*H10K 59/126* (2023.01)
(Continued)

(52) U.S. Cl.
CPC .......... *H10K 59/126* (2023.02); *H10K 50/11* (2023.02); *H10K 50/822* (2023.02); *H10K 71/621* (2023.02)

(58) Field of Classification Search
CPC ............. H01L 27/3272; H01L 51/5012; H01L 51/5225
See application file for complete search history.

(56) References Cited

U.S. PATENT DOCUMENTS

| 8,421,347 B2 | 4/2013 | Yamagishi et al. |
| 9,240,508 B2 | 1/2016 | Song et al. |
(Continued)

FOREIGN PATENT DOCUMENTS

| CN | 109300957 A | 2/2019 |
| CN | 110444125 A | 11/2019 |
(Continued)

*Primary Examiner* — Fernando L Toledo
*Assistant Examiner* — Valerie N Newton
(74) *Attorney, Agent, or Firm* — Innovation Counsel LLP

(57) ABSTRACT

A display panel includes a first display area including first light emitting areas and a second display area adjacent to the first display area and including second light emitting areas and a signal transmission area; a base substrate; a circuit element layer disposed on the base substrate; a light blocking pattern disposed between the base substrate and the circuit element layer, overlapping the first and second light emitting areas, and having a first opening corresponding to the signal transmission area; and a light emitting element layer disposed on the circuit element layer and including a first electrode overlapping the first and second light emitting areas, a light emitting layer disposed on the first electrode, and a second electrode overlapping the first and second light emitting areas. The signal transmission area has a second transmittance that is higher than a first transmittance of the second light emitting areas.

23 Claims, 15 Drawing Sheets

(51) Int. Cl.
*H10K 50/11* (2023.01)
*H10K 50/822* (2023.01)
*H10K 71/00* (2023.01)

(56) References Cited

U.S. PATENT DOCUMENTS

| | | |
|---|---|---|
| 10,840,317 B2 | 11/2020 | Oh et al. |
| 2016/0293687 A1* | 10/2016 | Chang .................. H01L 27/326 |
| 2017/0133444 A1* | 5/2017 | Lee ...................... H01L 51/5253 |
| 2017/0207285 A1* | 7/2017 | You ..................... H01L 27/3206 |
| 2017/0244069 A1* | 8/2017 | Kim .................... H01L 51/5284 |
| 2018/0040682 A1 | 2/2018 | Ebisuno et al. |
| 2020/0105844 A1 | 4/2020 | Wang et al. |

FOREIGN PATENT DOCUMENTS

| | | |
|---|---|---|
| KR | 10-1705201 B1 | 2/2017 |
| KR | 10-2017-0081010 A | 7/2017 |
| KR | 10-1945260 B1 | 2/2019 |
| KR | 10-2020-0102580 A | 9/2020 |

* cited by examiner

DISPLAY PANEL, METHOD OF MANUFACTURING THE SAME, AND DISPLAY DEVICE HAVING THE DISPLAY PANEL

CROSS-REFERENCE TO RELATED APPLICATION

This U.S. non-provisional patent application claims priorities under 35 U.S.C. § 119 of Korean Patent Application No. 10-2020-0037822, filed on Mar. 27, 2020, the disclosure of which is hereby incorporated by reference in its entirety.

BACKGROUND

1. Field of Disclosure

The present disclosure relates to a display panel, a method of manufacturing the same, and a display device including the display panel. More particularly, the present disclosure relates to a display panel including a transparent display with improved transmittance in a signal transmission area, a method of manufacturing the display panel, and a display device including the display panel.

2. Description of the Related Art

A display device may include various electronic modules and components, such as a display panel displaying an image, an input sensor sensing an external input. The electronic components are electrically connected by signal lines arranged in various ways and configurations. The display panel may include a light emitting element emitting a light. The input sensor may include sensing electrodes sensing the external input. Examples of the electronic modules include a camera, an infrared sensor, a proximity sensor, or the like. The electronic modules may be disposed under the display panel overlapping a display area of the display panel.

SUMMARY

The present disclosure provides a display panel having improved transmittance in a signal transmission area.

The present disclosure further provides a method of manufacturing the display panel that is capable of effectively removing a cathode of a light emitting element in the signal transmission area by irradiating an infrared laser beam without causing a damage to a light emitting area.

The present disclosure further provides a display device including the display panel.

According to one embodiment, a display panel includes a first display area including a plurality of first light emitting areas; a second display area adjacent to the first display area and including a plurality of second light emitting areas and a signal transmission area adjacent to the plurality of second light emitting areas, wherein the plurality of second light emitting areas in the second display area has a first transmittance, and the signal transmission area in the second display area has a second transmittance that is higher than the first transmittance of the plurality of second light emitting areas; a base substrate; a circuit element layer disposed on the base substrate; a light blocking pattern disposed between the base substrate and the circuit element layer, overlapping the plurality of first light emitting areas and the plurality of second light emitting areas, and having a first opening corresponding to the signal transmission area; and a light emitting element layer disposed on the circuit element layer. The light emitting element layer includes a first electrode overlapping the plurality of first light emitting areas and the plurality of second light emitting areas; a light emitting layer disposed on the first electrode and a second electrode overlapping the plurality of first light emitting areas and the plurality of second light emitting areas.

The second electrode may have a second opening corresponding to the signal transmission area, and an inner side surface of the second electrode that faces the second opening may include a plurality of concave-convex portions.

The inner side surface of the second electrode may face an outer line of the second opening when viewed in a plan view, and the outer line includes curved lines that are convex outwardly from the second opening.

The first opening and the second opening may be substantially aligned with each other in a cross-section.

The display panel may further include a first inorganic layer disposed between the base substrate and the circuit element layer, and the light blocking pattern may be disposed on or under the first inorganic layer.

The display panel may further include a second inorganic layer disposed between the base substrate and the first inorganic layer, and the light blocking pattern may be disposed between the first inorganic layer and the second inorganic layer.

The signal transmission area is provided in plural, and the plurality of second light emitting areas may be alternately arranged with a plurality of the signal transmission areas.

Each of the plurality of first light emitting areas and the plurality of second light emitting areas may include a plurality of sub-light emitting areas, and each of the sub-light emitting areas may include at least one of a first color light emitting area, a second color light emitting area, and a third color light emitting area.

A second light emitting area of the plurality of second light emitting areas may have substantially a same size as a size of the signal transmission area that is adjacent to the second light emitting area.

The light blocking pattern may include a metal layer, and the metal layer may absorb or reflect an infrared laser incident to the metal layer.

The second light emitting areas may transmit about 95% or higher of an infrared laser.

The light blocking pattern may have a first thickness greater than a second thickness of the second electrode.

The first thickness of the light blocking pattern may be in a first range from about 100 nm to about 500 nm, and the second thickness of the second electrode may be in a second range from about 5 nm to about 20 nm.

According to another embodiment, a method of manufacturing a display panel includes providing a preliminary display panel including a first display area including a plurality of first light emitting areas and a second display area adjacent to the first display area and including a plurality of second light emitting areas and a signal transmission area adjacent to the plurality of second light emitting areas, wherein the plurality of second light emitting areas in the second display area has a first transmittance, and the signal transmission area in the second display area has a second transmittance that is higher than the first transmittance of the plurality of second light emitting area; and irradiating a laser beam to the signal transmission area from a lower side of the preliminary display panel. The preliminary display panel includes a base substrate, a circuit element layer disposed on the base substrate, a light blocking pattern disposed between the base substrate and the circuit element layer, overlapping the plurality of first light emitting areas and the plurality of second light emitting areas, and having a first opening corresponding to the signal transmission area, and a light emitting element layer disposed on the circuit element layer. The light emitting element layer includes a first electrode overlapping the plurality of first light emitting areas and the plurality of second light emitting areas; a light emitting layer disposed on the first electrode; and a preliminary second electrode overlapping the plurality of first light emitting areas, the plurality of second light emitting areas, and the signal transmission area.

The base substrate, the circuit element layer, and the light emitting layer may transmit about 95% or higher of the laser beam.

The irradiating of the laser beam may include irradiating an infrared laser to the preliminary second electrode.

The irradiating of the laser beam may include irradiating the laser beam to a portion of the plurality of second light emitting areas adjacent to the signal transmission area.

The light blocking pattern may include a metal layer that absorbs or reflects the laser beam.

The irradiating of the laser beam may include removing a portion of the preliminary second electrode that corresponds to the signal transmission area.

According to another embodiment, a display device includes a display panel including a first display area and a second display area adjacent to the first display area and including a light emitting area and a signal transmission area, wherein the first display area has a first transmittance, and the second display area has a second transmittance that is higher than the first transmittance, and wherein the light emitting area has a third transmittance, and the signal transmission area has a fourth transmittance that is higher than the third transmittance of the light emitting area; and an electronic module disposed under the display panel and overlapping the second display area. The display panel includes a base substrate; a circuit element layer disposed on the base substrate; a light blocking pattern disposed between the base substrate and the circuit element layer, overlapping the first display area and the light emitting area, and having a first opening corresponding to the signal transmission area; and a light emitting element layer disposed on the circuit element layer. The light emitting element layer includes a first electrode overlapping the first display area and the light emitting area; a light emitting layer disposed on the first electrode; and a second electrode overlapping the first display area and the light emitting area.

The electronic module is provided in plural and a plurality of the electronic modules include a camera and a sensor.

The second electrode may have a second opening corresponding to the signal transmission area, and an inner side surface of the second electrode that faces the second opening may include a plurality of concave-convex portions.

The second transmittance may corresponds to an average of the third transmittance of the light emitting area and the fourth transmittance of the signal transmission area.

At least some of the above and other features of the invention are set out in the claims.

According to the above, the cathode (e.g., the second electrode of the light emitting element layer) that overlaps the signal transmission area may be effectively removed without causing a damage to the light emitting area that is adjacent to the signal transmission area. Thus, the transmittance of the signal transmission area of the display panel including the transparent display may be improved.

BRIEF DESCRIPTION OF THE DRAWINGS

The inventive concepts of the present disclosure will become readily apparent by reference to the following detailed description when considered in conjunction with the accompanying drawings wherein.

DETAILED DESCRIPTION

Figure 1:
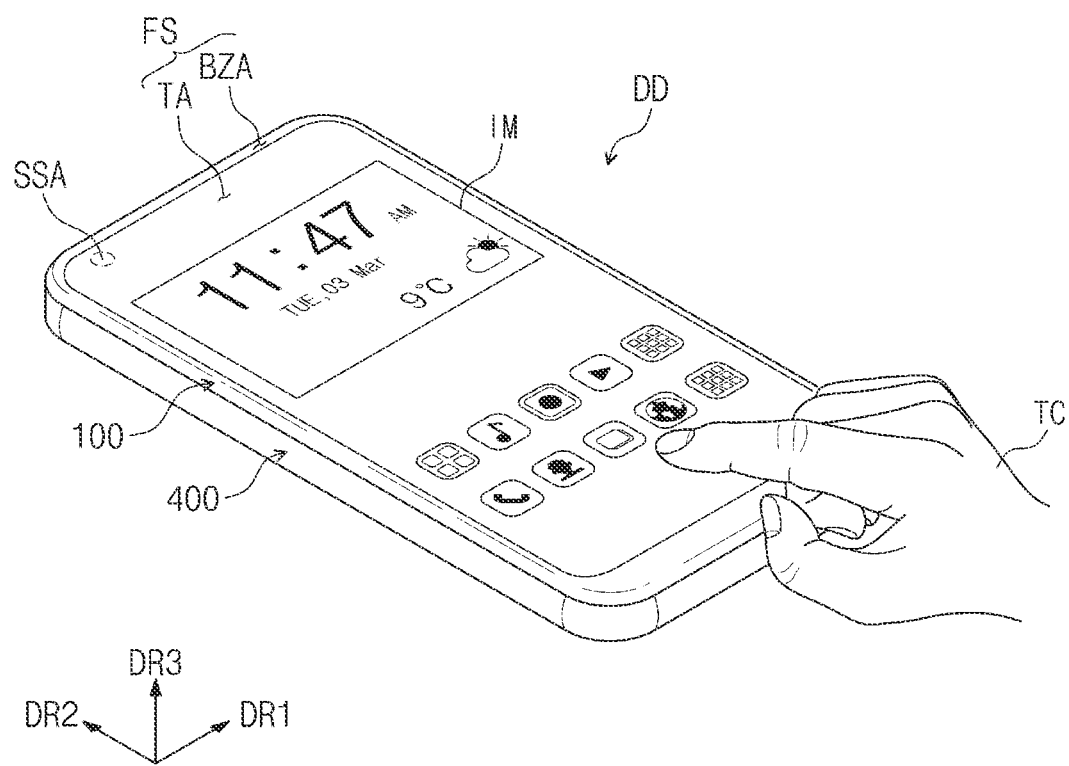
FIG. 1 is a perspective view of a display device according to an embodiment of the present disclosure.

In the present disclosure, it will be understood that when an element or layer is referred to as being "on," "connected to," or "coupled to" another element or layer, it can be directly on, connected, or coupled to the other element or layer or one or more intervening elements or layers may be present therebetween.

Like numerals refer to like elements throughout the present disclosure. In the drawings, a thickness, a ratio, and a dimension of components may be exaggerated for ease of description of the technical aspect. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed herein could be termed a second element, component, region, layer, or section without departing from the teachings of the present disclosure. As used herein, the singular forms, "a," "an," and "the" are intended to include the plural forms as well, unless the context clearly indicates otherwise.

Spatially relative terms, such as "beneath," "below," "lower," "above," "upper," and the like, may be used herein for ease of description to describe one element or feature's relationship to another element(s) or feature(s) as illustrated in the figures. It will be understood that the relative terms are intended to encompass different orientations of a device including an element in addition to the orientation illustrated in the figures. For example, if the device in one of the figures is turned over, elements described as being on a "lower" side of other elements would then be oriented to be on an "upper" side of the other elements. The term "lower" can, therefore, encompass both an orientation of "lower" and "upper" depending on the particular orientation of the figure. Similarly, if the device in one of the figures is turned over, elements described as "below" or "beneath" other elements would then be oriented to be "above" the other elements. The terms "below" or "beneath" can, therefore, encompass both an orientation of "above" and "below" depending on the particular orientation of the figure.

It will be further understood that the terms "includes" and/or "including", when used in the present disclosure, specify a presence of stated features, integers, steps, operations, elements, and/or components, but do not preclude a presence or an addition of one or more other features, integers, steps, operations, elements, components, and/or groups thereof.

Unless otherwise defined, terms (including technical and scientific terms) used herein have the same ordinary meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

Figure 2:
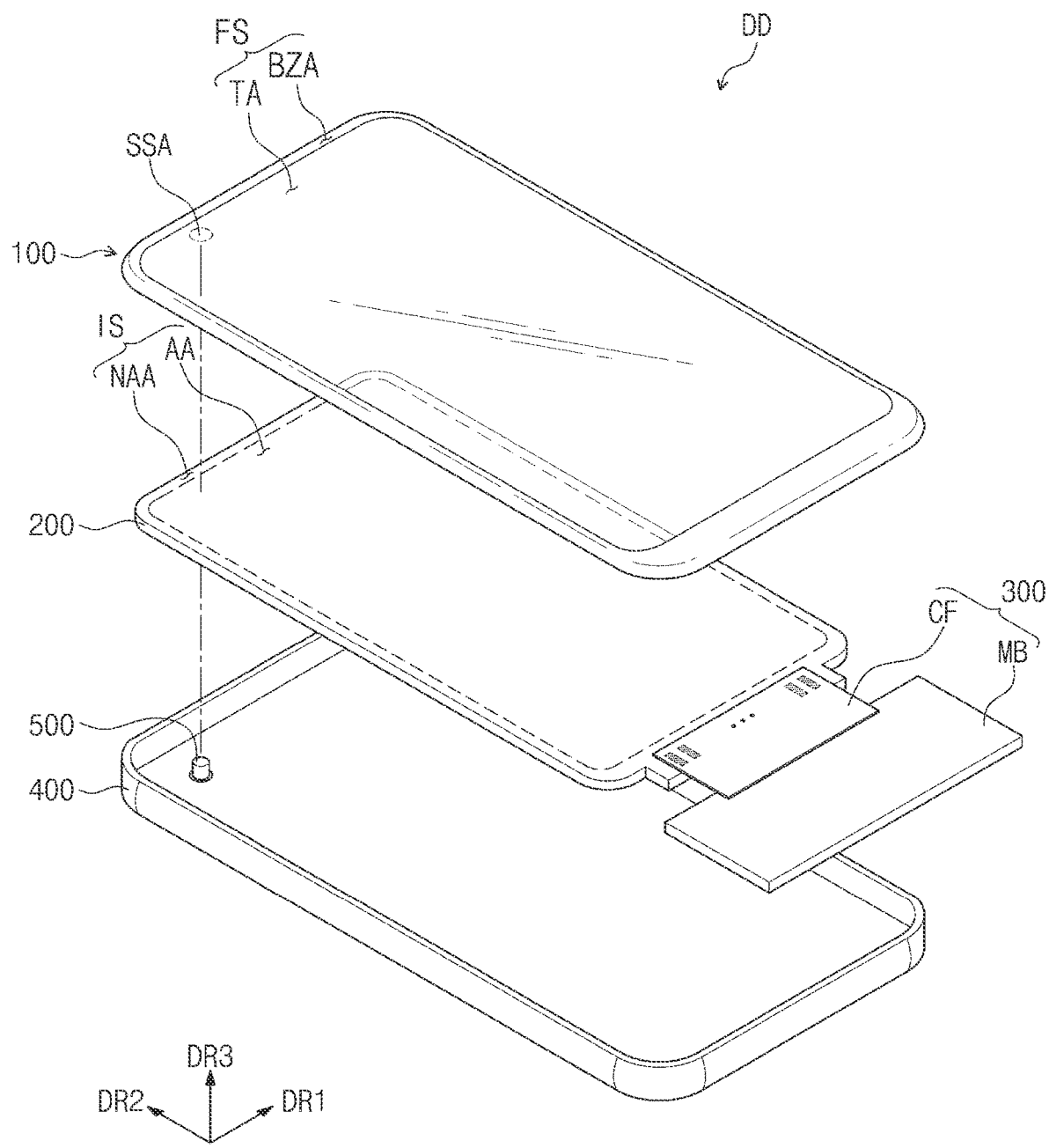
FIG. 2 is an exploded perspective view of a display device according to an embodiment of the present disclosure.

FIG. 1 is a perspective view of a display device DD according to an embodiment of the present disclosure, and FIG. 2 is an exploded perspective view of the display device DD according to an embodiment of the present disclosure.

Referring to FIGS. 1 and 2, the display device DD may be activated in response to electrical signals. The display device DD may be implemented in various sizes and configurations. For example, the display device DD may be applied to a large-sized electronic device, such as a television, a monitor, or an outdoor billboard, and a small- or medium-sized electronic device, such as a personal computer, a notebook computer, a tablet computer, a personal digital assistant, a car navigation device, a game device, a mobile electronic device, and a camera. However, these are merely examples, and the display device DD may be applied to other electronic devices without departing from the inventive concept of the present disclosure. Hereinafter, a smartphone will be described as a representative example of the display device DD.

The display device DD may display an image IM toward a third direction DR3 through a display surface FS that is substantially parallel to a plane defined by a first direction DR1 and a second direction DR2. The display surface FS through which the image IM is displayed may correspond to a front surface of the display device DD and a front surface of a window 100. Hereinafter, the display surface and the front surface of the display device DD and the front surface of the window 100 are assigned with the same reference numeral for convenience. The image IM may include a still image as well as a motion image. FIG. 1 shows a clock widget and application icons as a representative example of the image IM.

In the present embodiment, front (or upper) and rear (or lower) surfaces of each member may be defined with respect to a direction in which the image IM is displayed. The front and rear surfaces are opposite to each other in the third direction DR3, and a normal direction of each of the front and rear surfaces may be substantially parallel to the third direction DR3. The first direction DR1, the second direction DR2, and the third direction DR3 may be substantially perpendicular to each other.

In the present disclosure, a surface (e.g., the display surface FS) defined by the first direction DR1 and the second direction DR2 may be referred to as a plane or a planar surface, and the expression "when viewed in a plane" may mean a state of being viewed in the third direction DR3.

The display device DD may include the window 100, a display module 200, a driving circuit 300, a housing 400, and an electronic module 500. In the present embodiment, the window 100 and the housing 400 may be coupled to each other to form an exterior of the display device DD.

The window 100 may include an optically transparent insulating material. For example, the window 100 may include glass or plastic. The window 100 may have a single-layer or multi-layer structure. For example, the window 100 may include a plurality of plastic films attached to each other by an adhesive or may include a glass substrate and a plastic film attached to the glass substrate by an adhesive.

The window 100 may be divided into a transmission area TA and a bezel area BZA in a plane. The transmission area TA may correspond to an optically transparent area. The bezel area BZA may have a light transmittance that is relatively lower than that of the transmission area TA. The bezel area BZA may define a shape of the transmission area TA. The bezel area BZA may be disposed adjacent to the transmission area TA and may surround the transmission area TA.

The bezel area BZA may have a predetermined color. The bezel area BZA may cover a peripheral area NAA of the display module 200 to prevent the peripheral area NAA from being viewed from the outside. However, this is merely an embodiment, and the bezel area BZA may be omitted from the window 100 according to another embodiment of the present disclosure.

In the present embodiment, a sensing area SSA may overlap the electronic module 500 in the third direction DR3. The display device DD may receive external signals for the electronic module 500 or may provide output signals from the electronic module 500 to an external device or component through the sensing area SSA. According to the present disclosure, the sensing area SSA may overlap the transmission area TA. Accordingly, a separate area for providing the sensing area SSA outside of the transmission area TA, for example, the bezel area BZA, may be omitted. Therefore, a size of the bezel area BZA may be reduced.

FIGS. 1 and 2 show one sensing area SSA as a representative example, however, the present disclosure should not be limited thereto or thereby. For example, two or more sensing areas SSA may be provided without departing from the scope of the present disclosure. In addition, the sensing area SSA is shown to be in a left upper end of the transmission area TA, however, the sensing area SSA may be defined in various positions, such as a right upper end of the transmission area TA, a center of the transmission area TA, a left lower end of the transmission area TA, or a right lower end of the transmission area TA.

The display module 200 may be disposed under the window 100. The display module 200 may display the image IM. The display module 200 may include a front surface IS including an active area AA and the peripheral area NAA. The active area AA may be activated in response to electrical signals.

In the present embodiment, the active area AA of the display module 200 may correspond to the area in which the image IM is displayed. The transmission area TA of the window 100 may overlap the active area AA of the display module 200. For example, the transmission area TA may overlap at least a portion or an entire portion of the active area AA. Therefore, a user may view the image IM through the transmission area TA.

The peripheral area NAA of the display module 200 may be covered by the bezel area BZA of the window 100. The peripheral area NAA may be disposed adjacent to the active area AA. The peripheral area NAA may surround the active area AA. A driving circuit or a driving line to drive and activate the active area AA may be disposed in the peripheral area NAA.

In the present embodiment, the display module 200 may have a flat shape, and the active area AA and the peripheral area NAA face the window 100, however, this is merely an embodiment. For example, the display module 200 may be partially bent in the peripheral area NAA. In this case, the display module 200 may be bent toward a rear surface of the display device DD in the peripheral area NAA, and the size of the bezel area BZA may be reduced in the front surface of the display device DD. In another embodiment, the display module 200 may have a partially-bent shape in the active area AA. The peripheral area NAA may be omitted from the display module 200 according to another embodiment of the present disclosure.

The driving circuit 300 may be electrically connected to the display module 200. The driving circuit 300 may include a main circuit board MB and a flexible film CF.

The flexible film CF may be electrically connected to the display module 200. The flexible film CF may be connected to pads of the display module 200 that are arranged in the peripheral area NAA. The flexible film CF may provide electrical signals to the display module 200 to drive the display module 200. The electrical signals may be generated by the flexible film CF or the main circuit board MB. The main circuit board MB may include various driving circuits used to drive the display module 200 or a connector (not shown) to receive a power.

In the present embodiment, a portion of the active area AA of the display module 200 that corresponds to the sensing area SSA may have a relatively higher transmittance than the rest of the active area AA that does not overlap the sensing area SSA. For example, at least some of the components of the display module 200 may be omitted in the portion of the active area AA corresponding to the sensing area SSA. The electronic module 500 may easily transmit and/or receive signals through the sensing area SSA.

The electronic module 500 may be disposed under the display module 200. The electronic module 500 may overlap the sensing area SSA when viewed in a plane. The electronic module 500 may receive an external input signal transmitted through the sensing area SSA or may provide an output signal through the sensing area SSA. The electronic module 500 may include a camera or various sensors, for example, an infrared sensor, a proximity sensor, or the like.

The housing 400 may be coupled to the window 100. The housing 400 coupled to the window 100 may provide an inner space of the display device DD. The display module 200 and the electronic module 500 may be accommodated in the inner space.

The housing 400 may include a material with a relatively high rigidity. For example, the housing 400 may include a plurality of frames and/or plates containing glass, plastic, metal, or a combination thereof. The housing 400 may stably protect the components of the display device DD that are accommodated in the inner space from external impacts.

Figure 3:
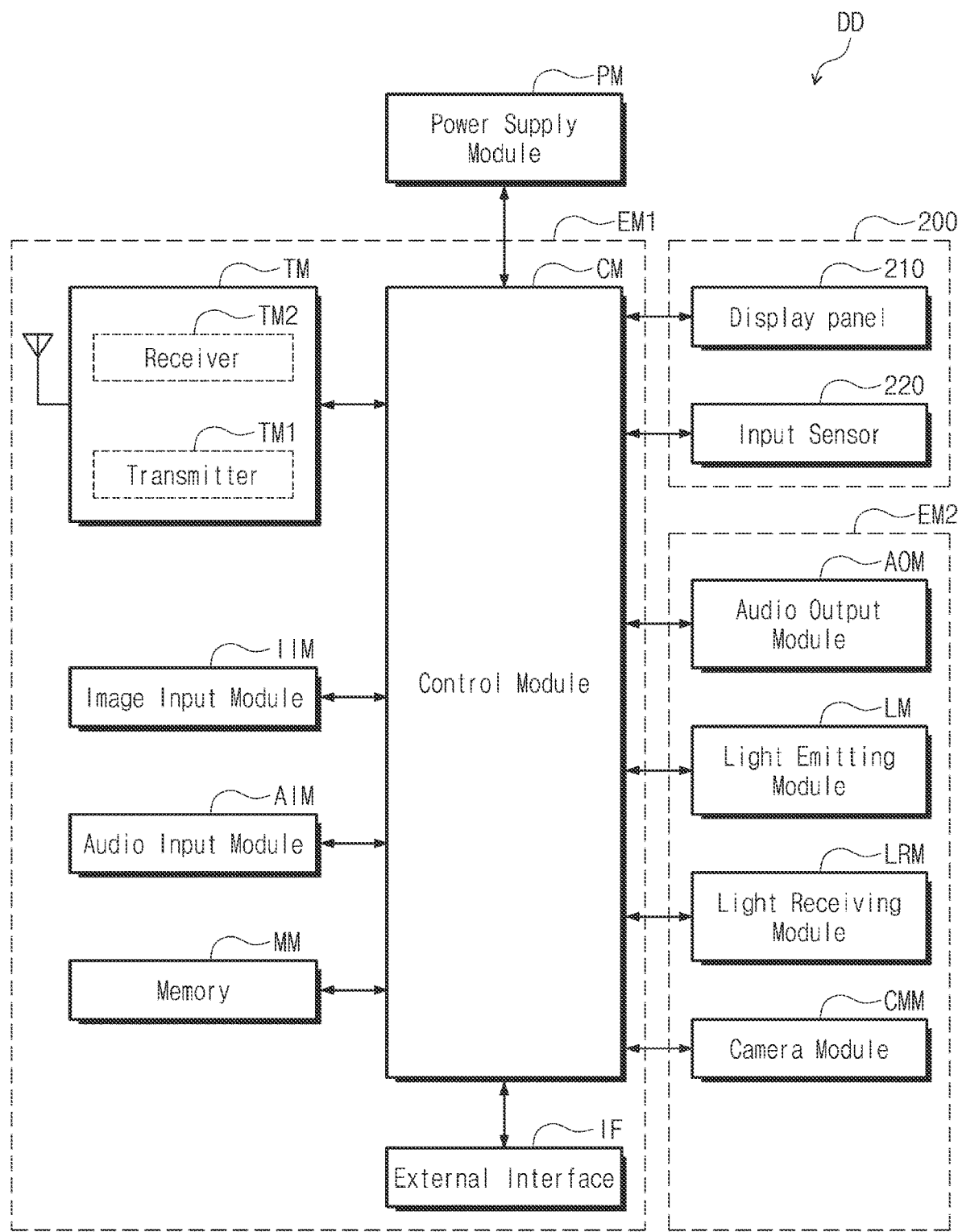
FIG. 3 is a block diagram showing a display device according to an embodiment of the present disclosure.

FIG. 3 is a block diagram showing the display device DD according to an embodiment of the present disclosure.

Referring to FIG. 3, the display device DD may include the display module 200, a power supply module PM, a first electronic module EM1, and a second electronic module EM2. The display module 200, the power supply module PM, the first electronic module EM1, and the second electronic module EM2 may be electrically connected to each other.

The display module 200 may include a display panel 210 and an input sensor 220.

The display panel 210 may generate the image IM. The image IM generated by the display panel 210 may be displayed through the front surface IS and viewed by a user through the transmission area TA.

The input sensor 220 may sense an external input TC. For example, the input sensor 220 may sense the external input TC provided through the window 100. The external input TC may be a user input. The user input may include various forms and types of external inputs, for example, an input from and by a portion of the user's body, a pen, or a stylus, a light input, a heat input, or a pressure input. In the present embodiment, the external input TC is shown as a touch operation using the user's hand provided via the front surface IS, however, this is merely an example. As described above, the external input TC may be provided in various forms and types. For example, the input sensor 220 may sense the external input TC that is applied to a side or front surface IS of the display device DD. It is understood that the present disclosure should not be limited to a particular embodiment.

The power supply module PM may supply a power for operating the display device DD. The power supply module PM may include a battery module.

The first electronic module EM1 and the second electronic module EM2 may include various modules that may operate in conjunction with the display device DD.

The first electronic module EM1 may be mounted directly on a mother board that is electrically connected to the display module 200 or may be electrically connected to the mother board through a connector (not shown) after being mounted on a separate board.

The first electronic module EM1 may include a control module CM, a wireless communication module TM, an image input module IIM, an audio input module AIM, a memory MM, and an external interface IF. Some of the modules included in the first electronic module EM1 may be electrically connected to the mother board through a respective flexible printed circuit board without being mounted on the mother board.

The control module CM may control the operation of the display device DD. The control module CM may be, but is not limited to, a microprocessor, a microcontroller, a central processing unit (CPU), and a graphics processing unit (GPU). For example, the control module CM may activate or deactivate the display module 200. The control module CM may control other modules, for example, the image input module IIM or the audio input module AIM, based on a touch signal provided by a user and received from the display module 200.

The wireless communication module TM may transmit/receive a wireless signal to/from another wireless communication terminal via a wireless communication link such as a Bluetooth link or a Wi-Fi link. The wireless communication module TM may transmit/receive a voice signal using an audio communication line. The wireless communication module TM may include a transmitter TM1 that modulates a signal to be transmitted and transmits the modulated signal and a receiver TM2 that demodulates a modulated signal that is received via the wireless communication link.

The image input module IIM may process an image signal and may convert the image signal into image data that may be provided to the display module 200 to display an image. The audio input module AIM may receive an external audio signal through a microphone in a recording mode or a voice recognition mode and may convert the audio signal into electrical voice data.

The external interface IF may serve as an interface between the control module CM and external devices, such as an external charger, a wired/wireless data port, and a card socket (e.g., a memory card and a subscriber identity module (SIM)/a removable user identity module (R-UIM) card).

The second electronic module EM2 may include an audio output module AOM, a light emitting module LM, a light receiving module LRM, and a camera module CMM. The components of the second electronic module EM2 may be mounted directly on a mother board, may be electrically connected to the display module 200 through a connector (not shown) after being mounted on a separate board, or may be electrically connected to the first electronic module EM1.

The audio output module AOM may convert and output the audio data received from the wireless communication module TM or the audio data stored in the memory MM.

The light emitting module LM may generate and emit a light. The light emitting module LM may emit an infrared ray. The light emitting module LM may include a light emitting diode (LED) that may emit a visible light. The light receiving module LRM may sense the infrared ray. The light receiving module LRM may sense an infrared ray having a predetermined level or higher. The light receiving module LRM may include a complementary metal oxide semiconductor (CMOS) sensor. In one embodiment, the infrared ray generated by and emitted from the light emitting module LM may be incident to the light receiving module LRM after being reflected by an external object, e.g., a user's finger or face. The camera module CMM may photograph an external image.

The electronic module 500 described with reference to FIG. 2 may include at least one of the first electronic module EM1 and the second electronic module EM2. For example, the electronic module 500 may include at least one of the audio output module AOM, the light emitting module LM, the light receiving module LRM, the camera module CMM, and a heat sensing module (not shown). The electronic module 500 may sense an external object through the sensing area SSA or may provide an audio signal such as a voice signal or emit a light such as an infrared ray.

Figure 4A:
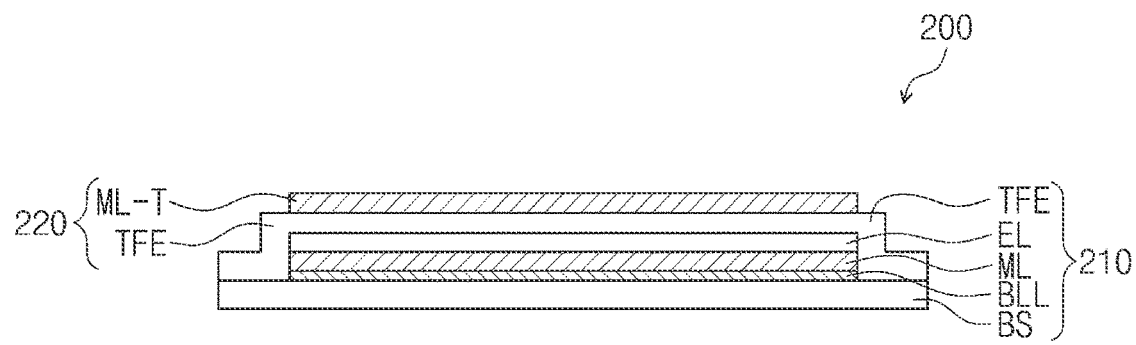
FIGS. 4A and 4B are cross-sectional views of a display module according to some embodiments of the present disclosure.
Figure 4A:
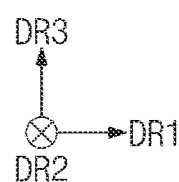
Figure 4B:
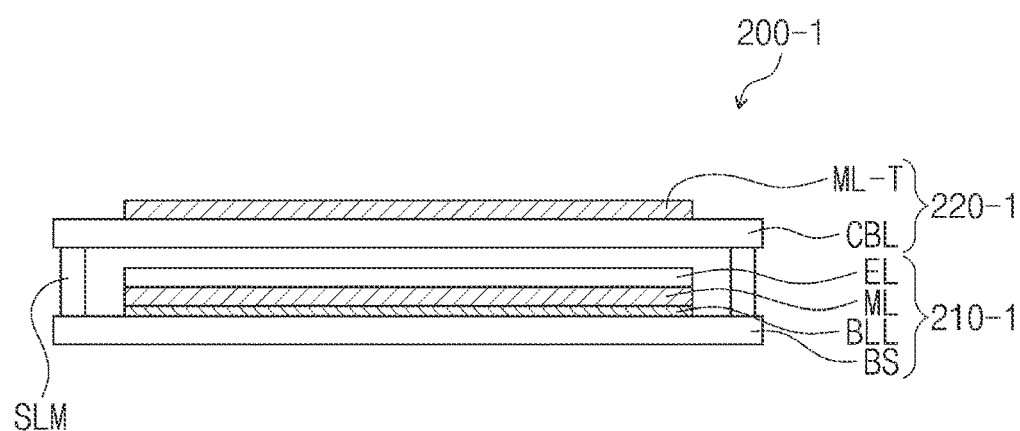
Figure 4B:
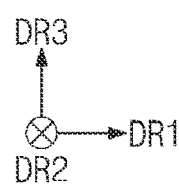

FIGS. 4A and 4B are cross-sectional views of a display module according to some embodiments of the present disclosure.

FIG. 4A is a cross-sectional view of the display module 200 of FIG. 2 according to an embodiment of the present disclosure.

Referring to FIGS. 3 and 4A, the display module 200 may include the display panel 210 and the input sensor 220. The display panel 210 may include a base substrate BS, a circuit element layer ML, a light emitting element layer EL, and a thin film encapsulation layer TFE. The display panel 210 may further include a light blocking pattern BLL between the base substrate BS and the circuit element layer ML. The input sensor 220 may include a base layer and a sensing circuit layer ML-T. The thin film encapsulation layer TFE and the base layer may be the same layer, and the base layer may also be hereinafter referred to as the thin film encapsulation layer TFE or the base layer TFE.

According to the present embodiment, the display panel 210 and the input sensor 220 may be formed by successive processes. For example, the sensing circuit layer ML-T may be formed directly on the thin film encapsulation layer (or the base layer) TFE.

The base substrate BS may be a silicon substrate, a plastic substrate, a glass substrate, an insulating film, or a stacked structure including a plurality of insulating layers.

The circuit element layer ML may be disposed on the base substrate BS. The circuit element layer ML may include a plurality of insulating layers, a plurality of conductive layers, and at least one semiconductor layer. The conductive layers of the circuit element layer ML may include signal lines and/or a pixel control circuit.

The light blocking pattern BLL may block light or a laser beam incident to the display panel 210 that may pass through the base substrate BS. This will be described in detail with reference to FIG. 9.

The light emitting element layer EL may be disposed on the circuit element layer ML. The light emitting element layer EL may generate and emit light. In the example of an organic light emitting display panel, a light emitting layer may include an organic light emitting material. A light emitting layer of a quantum dot light emitting display panel may include at least one of a quantum dot and a quantum rod.

The sensing circuit layer ML-T of the input sensor 220 may be disposed on the base layer TFE. The sensing circuit layer ML-T may include a plurality of insulating layers and a plurality of conductive layers. The conductive layers may include a sensing electrode that senses an external input, a sensing line that is connected to the sensing electrode, and a sensing pad that is connected to the sensing line.

FIG. 4B is a cross-sectional view of a display module 200-1 according to another embodiment of the present disclosure. In FIG. 4B, the same reference numerals denote the same elements in FIG. 4A, and detailed descriptions of the same elements will be omitted.

Referring to FIG. 4B, the display module 200-1 may include a display panel 210-1 and an input sensor 220-1. The display panel 210-1 may include the base substrate BS, the circuit element layer ML, and the light emitting element layer EL. The input sensor 220-1 may include a cover substrate CBL and the sensing circuit layer ML-T.

The cover substrate CBL may be disposed on the light emitting element layer EL. The cover substrate CBL may be a silicon substrate, a plastic substrate, a glass substrate, an insulating film, or a stacked structure including a plurality of insulating layers. A predetermined space (or a gap) may be defined between the cover substrate CBL and the light emitting element layer EL. The space may be filled with air or an inert gas. In addition, in the present embodiment, the space may be filled with a filler such as a silicone-based polymer, an epoxy-based resin, or an acrylic-based resin.

A coupling member SLM may be disposed between the base substrate BS and the cover substrate CBL. The coupling member SLM may couple the base substrate BS and the cover substrate CBL. The coupling member SLM may include an organic material, such as a photo-curable resin or a photo-plastic resin, or may include an inorganic material, such as a frit seal, however, the present disclosure should not be limited to a particular example.

Figure 5:
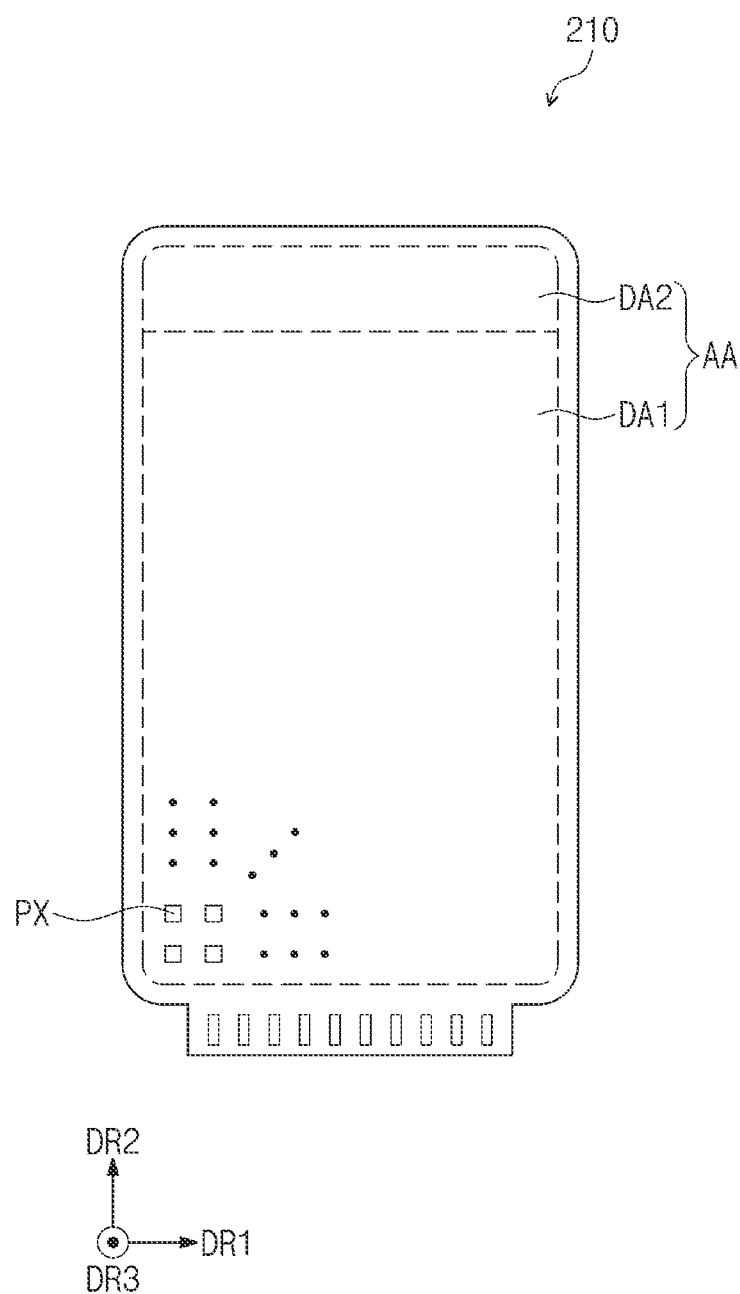
FIG. 5 is a plan view of a display panel according to an embodiment of the present disclosure.

FIG. 5 is a plan view of the display panel 210 according to an embodiment of the present disclosure.

Referring to FIG. 5, an active area AA of the display panel 210 may correspond to the active area AA of the display module 200 described with reference to FIG. 2. Hereinafter, the active area AA may refer to either the active area AA of the display panel 210 or the active area AA of the display module 200 depending on the context.

A plurality of pixels PX may be arranged in the active area AA extending in the first direction DR1 and the second direction DR2. Each of the pixels PX may display one of primary colors or one of mixture colors. The primary colors may include red, green, and blue. The mixture colors may include a variety of colors, such as white, yellow, cyan, magenta, etc. However, the colors displayed by the pixels PX should not be limited thereto or thereby.

The active area AA may include a first display area DA1 and a second display area DA2.

The electronic module 500 (refer to FIG. 2) may be disposed under the second display area DA2. The first display area DA1 may have a first transmittance, and the second display area DA2 may have a second transmittance. The second transmittance may be higher than the first transmittance. Accordingly, signals may be easily transmitted and/or received to and/or from the electronic module 500 (refer to FIG. 2) through the second display area DA2. Some components or portions thereof may be omitted in the second display area DA2 to increase the transmittance. For example, some pixels among the pixels PX arranged in the second display area DA2 may be omitted.

When viewed in a plane, the second display area DA2 may overlap the sensing area SSA shown in FIG. 2. The second display area DA2 may have a size greater than that of the sensing area SSA.

The first display area DA1 and the second display area DA2 may be adjacent to each other in the second direction DR2. A boundary between the first display area DA1 and the second display area DA2 may extend in the first direction DR1. When viewed in a plane, the first display area DA1 may correspond to an upper portion the display panel 210.

Figure 6:
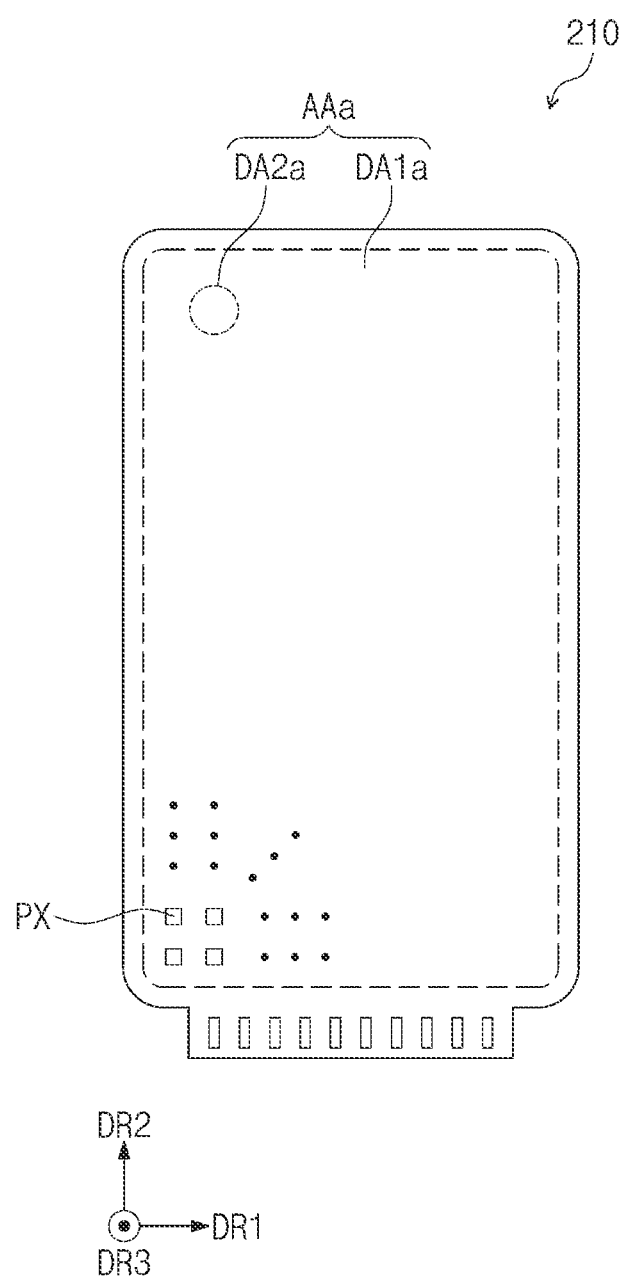
FIG. 6 is a plan view of a display panel according to an embodiment of the present disclosure.

FIG. 6 is a plan view of the display panel 210 according to an embodiment of the present disclosure.

In FIG. 6, the same reference numerals denote the same elements in FIG. 5, and detailed descriptions of the same elements will be omitted.

Referring to FIG. 6, an active area AAa may include a first display area DA1a and a second display area DA2a. In the present embodiment, the second display area DA2a may correspond to the sensing area SSA shown in FIG. 2. FIG. 6 shows one second display area DA2a. However, in a case where the sensing area SSA is provided in plural corresponding to different areas in the active area AAa, the second display area DA2a may be provided in plural to correspond to the plurality of the sensing areas SSA. The second display area DA2a may be surrounded by the first display area DA1a.

Figure 7:
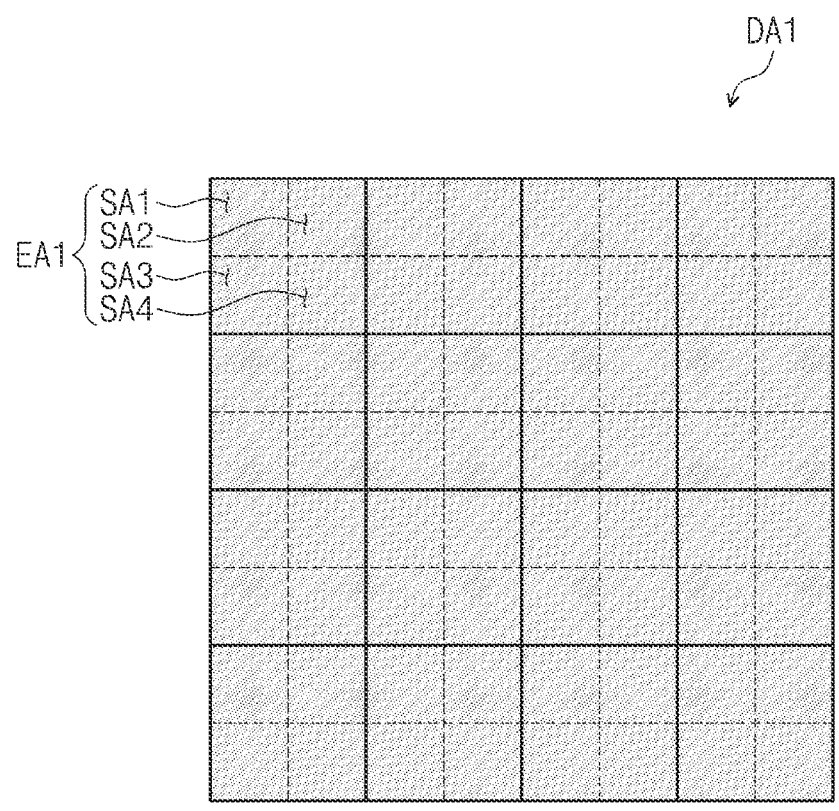
FIG. 7 is an enlarged plan view of a portion of a display panel according to an embodiment of the present disclosure.
Figure 7:
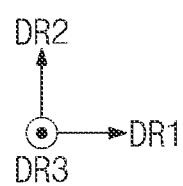

FIG. 7 is an enlarged plan view of a portion of the display panel according to an embodiment of the present disclosure. As an embodiment, FIG. 7 shows a portion of the first display area DA1 of the display panel 210 according to an embodiment of the present disclosure.

Referring to FIG. 7, the first display area DA1 may include a plurality of first light emitting areas EA1. Each of the first light emitting areas EA1 may include a plurality of sub-light emitting areas SA1, SA2, SA3, and SA4. FIG. 7 shows four sub-light emitting areas, e.g., first, second, third, and fourth sub-light emitting areas SA1, SA2, SA3, and SA4, as an example of the sub-light emitting areas of each of the first light emitting areas EA1, however, the number of the sub-light emitting areas may be smaller or greater than four. The pixels PX may be respectively disposed in the plurality of first light emitting areas EA1.

The first light emitting areas EA1 may be arranged in the first direction DR1 and the second direction DR2. Each of the first light emitting areas EA1 may correspond to a unit of a light emitting area that includes the sub-light emitting areas SA1 to SA4.

Each of the sub-light emitting areas SA1 to SA4 may include at least one of a first color light emitting area, a second color light emitting area, and a third color light emitting area. In one embodiment, the first color light emitting area may correspond to an area from which a red light is emitted, the second color light emitting area may correspond to an area from which a green light is emitted, and the third color light emitting area may correspond to an area from which a blue light is emitted. In one embodiment, each of the first light emitting areas EA1 may include at least one first color light emitting area, two second color light emitting areas, and one third color light emitting area. For example, at least two sub-light emitting areas among the first to fourth sub-light emitting areas SA1 to SA4 may include one first color light emitting area and one second color light emitting area, and the other two sub-light emitting areas among the first to fourth sub-light emitting areas SA1 to SA4 may include one second color light emitting area and one third color light emitting area. The first to fourth sub-light emitting areas SA1 to SA4 may be defined in various ways and configurations in each of the first light emitting areas EA1.

Figure 8A:
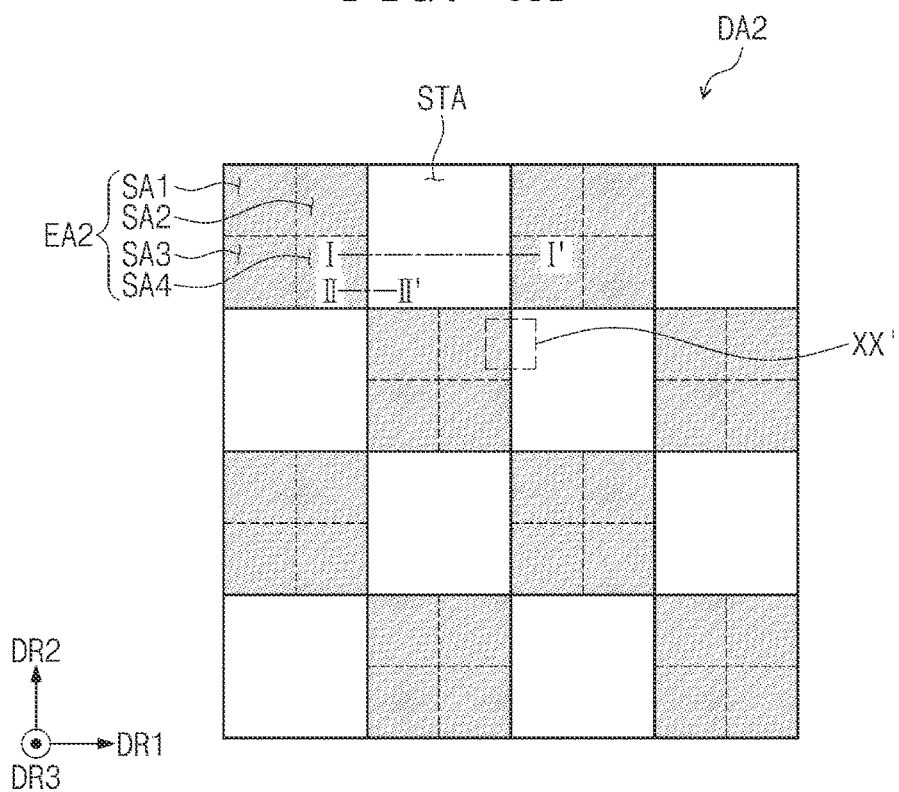
FIGS. 8A and 8B are enlarged plan views of a portion of a display panel according to some embodiments of the present disclosure.
Figure 8B:
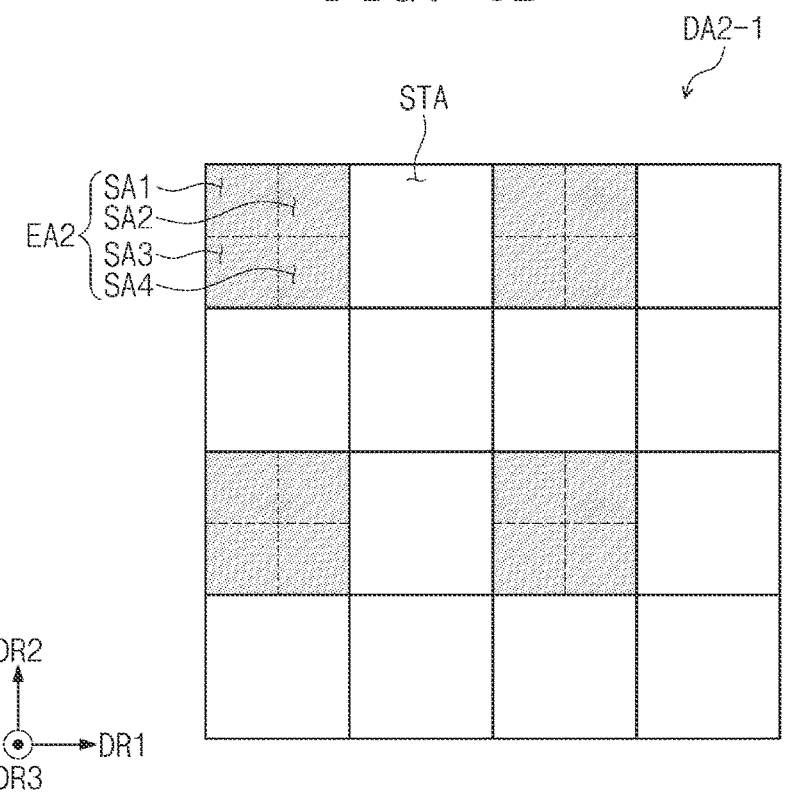

FIGS. 8A and 8B are enlarged plan views of a portion of a display panel according to some embodiments of the present disclosure.

FIG. 8A shows a portion of the second display area DA2 of the display panel 210 according to an embodiment of the present disclosure, and FIG. 8B shows a portion of a second display area DA2-1 of the display panel 210 according to another embodiment of the present disclosure.

Referring to FIGS. 8A and 8B, each of the second display areas DA2 and DA2-1 may include a plurality of second light emitting areas EA2 and a signal transmission area STA.

In some embodiments, the pixels PX may be disposed in the second light emitting areas EA2. Each of the second light emitting areas EA2 may include a plurality of sub-light emitting areas SA1, SA2, SA3, and SA4. Each of the first, second, third, and fourth sub-light emitting areas SA1, SA2, SA3, and SA4 may include at least one of a first color light emitting area, a second color light emitting area, and a third color light emitting area. In the some embodiments, each of the first, second, third, and fourth sub-light emitting areas SA1, SA2, SA3, and SA4 of the second light emitting areas EA2 may include a color light emitting area having a color that is different from that of each of the first, second, third, and fourth sub-light emitting areas SA1, SA2, SA3, and SA4 of the first light emitting areas EA1 shown in FIG. 7. Further, the number of the first to third color light emitting areas included in each of the first, second, third, and fourth sub-light emitting areas SA1, SA2, SA3, and SA4 of the second light emitting areas EA2 may be different from the number of the first to third color light emitting areas included in each of the first, second, third, and fourth sub-light emitting areas SA1, SA2, SA3, and SA4 of the first light emitting areas EA1 shown in FIG. 7.

The signal transmission area STA may be disposed adjacent to respective ones of the second light emitting areas EA2. The signal transmission area STA may have a transmittance higher than a transmittance of the second light emitting area EA2. The second display area DA2 may have a transmittance corresponding to an average of the transmittance of the second light emitting areas EA2 and the transmittance of the signal transmission area STA. In some embodiments, the pixels PX may not be disposed in the signal transmission area STA.

Referring to FIG. 8A, the signal transmission area STA may be provided in plural. The signal transmission areas STA may be alternately arranged with the second light emitting areas EA2. The number of the signal transmission areas STA in the second display area DA2 may be equal to the number of the second light emitting areas EA2 in the second display area DA2. A size of the signal transmission areas STA in the second display area DA2 may be substantially the same as a size of the second light emitting areas EA2 adjacent thereto in the second display area DA2.

Referring to FIG. 8B, the signal transmission area STA may be provided in plural. The number of the signal transmission areas STA in the second display area DA2-1 may be greater than the number of the second light emitting areas EA2. The signal transmission area STA may surround each of the second light emitting areas EA2. For example, three signal transmission areas STA may be defined to correspond to one second light emitting area EA2 adjacent thereto.

Figure 9:
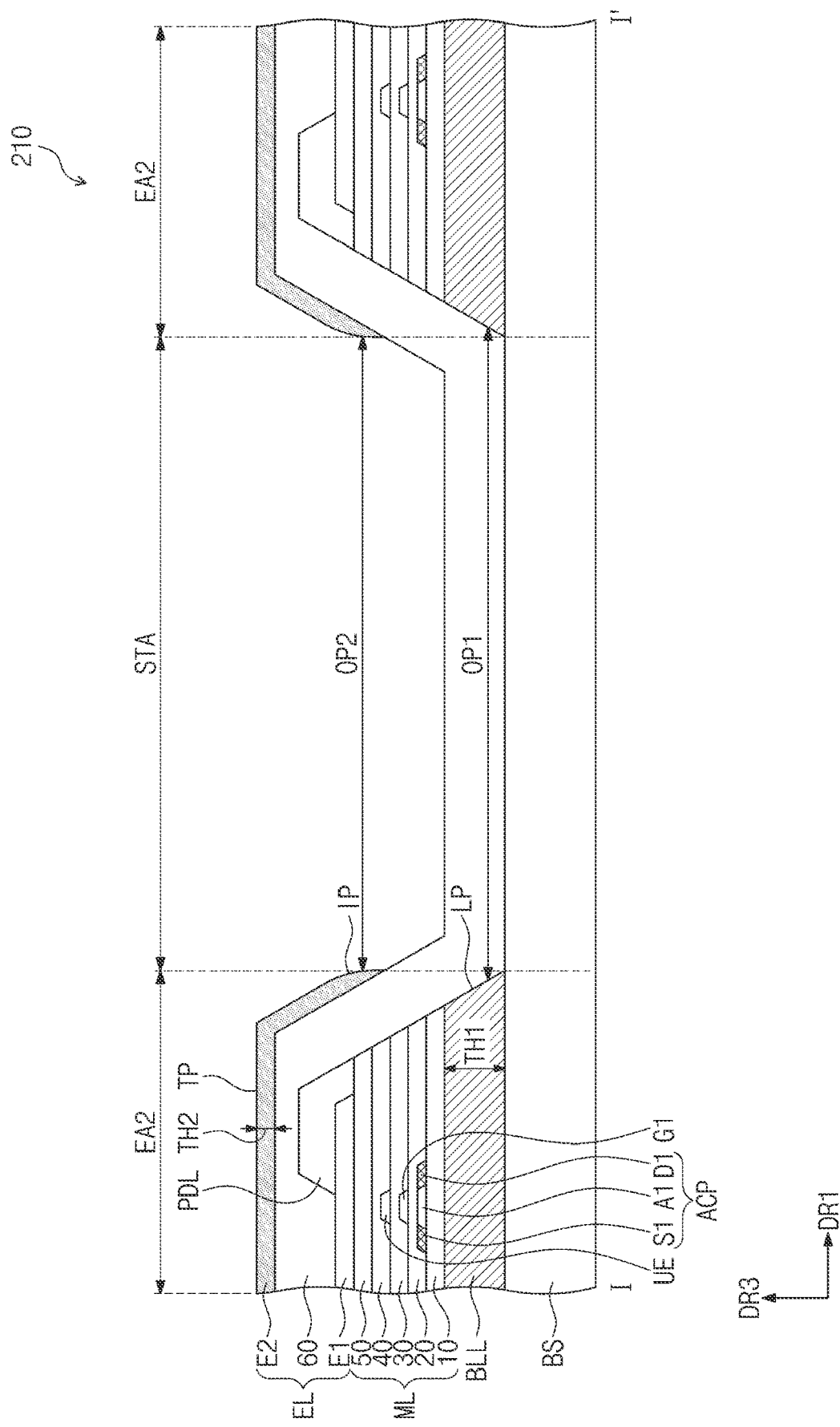
FIG. 9 is a cross-sectional view of a display panel according to an embodiment of the present disclosure.
Figure 10:
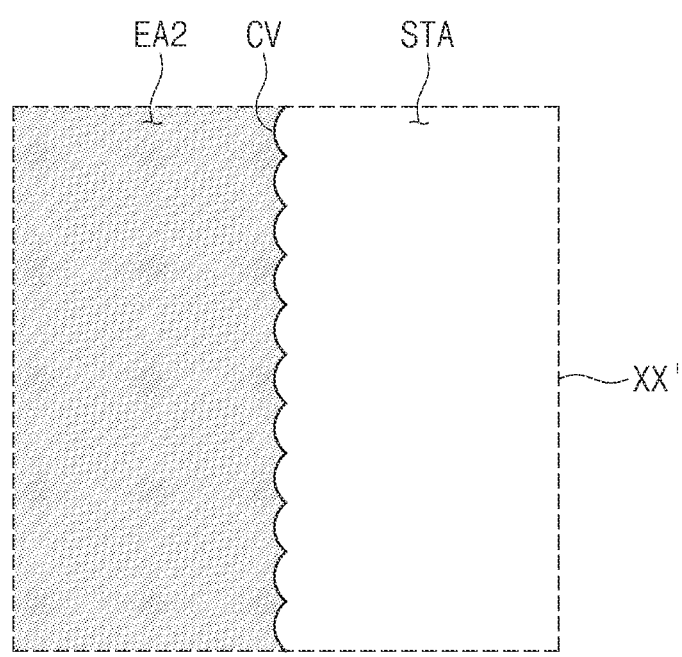
FIG. 10 is an enlarged view of an area XX' of FIG. 8A.

FIG. 9 is a cross-sectional view of the display panel 210 according to an embodiment of the present disclosure. FIG. 9 shows a cross-sectional view taken along a line I-I' of FIG. 8A. FIG. 10 is an enlarged view of an area XX' of FIG. 8A.

Referring to FIG. 9, the second light emitting area EA2 and the signal transmission area STA included in the second display area DA2 of the display panel 210 are shown. The display panel 210 may include the base substrate BS, the circuit element layer ML, the light blocking pattern BLL, and the light emitting element layer EL.

The base substrate BS may be a flexible substrate. The base substrate BS may include polyimide (PI). In one embodiment, the base substrate BS may include one or more polyimide layers and an inorganic layer. For example, the base substrate BS may include a first polyimide layer, the inorganic layer disposed on the first polyimide layer, and a second polyimide layer disposed on the inorganic layer.

The circuit element layer ML may include a first insulating layer 10. The first insulating layer 10 may be disposed on the light blocking pattern BLL. The first insulating layer 10 may include a barrier layer and/or a buffer layer. According to one embodiment, the barrier layer may be disposed on the light blocking pattern BLL, and the buffer layer may be disposed on the barrier layer. According to another embodiment, the buffer layer may be disposed on the light blocking pattern BLL, and the barrier layer may be disposed on the buffer layer. The barrier layer may include an inorganic material. The barrier layer may prevent oxygen or moisture that may be introduced through the base substrate BS from entering the pixels PX. The buffer layer may include an inorganic material. The buffer layer may have a surface energy lower than that of the base substrate BS such that the pixels PX may be stably formed on the base substrate BS.

A semiconductor pattern ACP may be disposed on the first insulating layer 10. The semiconductor pattern ACP may form a transistor. The semiconductor pattern ACP may include polysilicon, amorphous silicon, or metal oxide semiconductor. The semiconductor pattern ACP may include a source S1, a drain D1, and an active region A1. A second insulating layer 20 may be disposed on the first insulating layer 10 and may cover the semiconductor pattern ACP. A gate G1 may be disposed on the second insulating layer 20.

A third insulating layer 30 may be disposed on the second insulating layer 20 and may cover the gate G1. An upper electrode UE may be disposed on the third insulating layer 30. A fourth insulating layer 40 may be disposed on the third insulating layer 30 and may cover the upper electrode UE. A fifth insulating layer 50 may be disposed on the fourth insulating layer 40. The fifth insulating layer 50 may include an organic material and/or an inorganic material and may have a single-layer or multi-layer structure. The first to fifth insulating layers 10 to 50 may be referred to as the circuit element layer ML. The circuit element layer ML may overlap the first display area DA1 shown in FIG. 7 and may overlap the second light emitting area EA2 of the second display area DA2 or DA2-1 shown in FIGS. 8A and 8B. In the present embodiment, the circuit element layer ML may not be disposed in the signal transmission area STA. The structure of the circuit element layer ML shown in FIG. 9 is merely an example and may be provided in various ways and configurations without deviating from the scope of the present disclosure.

The light emitting area including the first light emitting areas EA1 (refer to FIG. 7) and the second light emitting areas EA2 (refer to FIGS. 8A and 8B) may include a light emitting portion and a line portion in which lines are arranged. In this case, the light emitting portion may correspond to a portion from which light is emitted in the pixel PX, the line portion may correspond to a portion except the light emitting portion. The first light emitting areas EA1 and the second light emitting areas EA2 may correspond to areas distinguished from the signal transmission area STA in the first display area DA1 and the second display area DA2.

The light emitting element layer EL may include a first electrode E1, a light emitting layer 60, and a second electrode E2.

The first electrode E1 may correspond to a pixel electrode. The first electrode E1 may be disposed on the fifth insulating layer 50. The first electrode E1 may be connected to the transistor via a contact hole (not shown) penetrating through the fifth insulating layer 50. The light emitting layer 60 may be disposed on the first electrode E1. The second electrode E2 may be disposed on the light emitting layer 60. The second electrode E2 may correspond to a common electrode. The second electrode E2 of the light emitting element layer EL may be referred to as a cathode. The light emitting layer 60 may include an organic material. The light emitting layer 60 may include an electron control layer (not shown) and a hole control layer (not shown).

The first electrode E1 may overlap the first light emitting areas EA1 (refer to FIG. 7) and the second light emitting areas EA2 (refer to FIGS. 8A and 8B). The light emitting layer 60 may overlap the second light emitting areas EA2 and the signal transmission area STA. The second electrode E2 may overlap the first light emitting areas EA1 and the second light emitting areas EA2. A pixel definition layer PDL may be disposed on the first electrode E1. The pixel definition layer PDL may correspond to the light emitting portion (not shown). The second electrode E2 may include a metal material. The second electrode E2 may have a thickness TH2 in a range from about 5 nm to about 20 nm.

The light blocking pattern BLL may be disposed on the base substrate BS. The light blocking pattern BLL may include a metal material. The light blocking pattern BLL may include molybdenum (Mo), titanium (Ti), aluminium (Al), silver (Ag), copper (Cu), or the like. The light blocking pattern BLL may have a thickness TH1 that is greater than the thickness TH2 of the second electrode E2. The thickness TH1 of the light blocking pattern BLL may be in a range from about 100 nm to about 500 nm. The thickness TH1 of the light blocking pattern BLL may be sufficiently thick to be able to absorb an infrared laser incident thereto. According to another embodiment, although not shown in the figures, the light blocking pattern BLL may be disposed under the base substrate BS. In this case, the light blocking pattern BLL may be patterned to overlap the second light emitting areas EA2 under the base substrate BS, and the light blocking pattern BLL may absorb (or reflect) the infrared laser incident to the base substrate BS from a lower side of the base substrate BS.

The light blocking pattern BLL may overlap the first light emitting areas EA1 (refer to FIG. 7) and the second light emitting areas EA2 (refer to FIGS. 8A and 8B). Referring to FIG. 9, the light blocking pattern BLL may have a first opening OP1 corresponding to the signal transmission area STA. The first opening OP1 may be defined by an inner side surface LP of the light blocking pattern BLL.

According to one embodiment, as shown in FIG. 9, the inner side surface LP of the light blocking pattern BLL may be defined as a plane that is continuous from an inner side surface of the circuit element layer ML. According to another embodiment, the light blocking pattern BLL may be patterned separately in a different way from the circuit element layer ML. In this case, the inner side surface LP of the light blocking pattern BLL may not be aligned with the inner side surface of the circuit element layer ML. According to another embodiment, the inner side surface LP of the light blocking pattern BLL may be defined as a plane that is discontinuous from the inner side surface of the circuit element layer ML. For example, the inner side surface LP of the light blocking pattern BLL may protrude more than the inner side surface of the circuit element layer ML in the first direction DR1. In another example, the inner side surface LP of the light blocking pattern BLL may be recessed more than the inner side surface of the circuit element layer ML in the first direction DR1.

The second electrode E2 may have a second opening OP2 corresponding to the signal transmission area STA. The second opening OP2 may be substantially aligned with the first opening OP1 when viewed in a cross-section. For example, an inner side surface IP of the second electrode E2 may be substantially aligned with the inner side surface LP of the light blocking pattern BLL. In another example, the inner side surface IP of the second electrode E2 may protrude or be recessed more than the inner side surface LP of the light blocking pattern BLL having a difference in the first direction DR1.

Referring to FIGS. 9 and 10, the second opening OP2 may include a plurality of concave-convex portions CV. The inner side surface IP of the second electrode E2 may correspond to the second opening OP2. The inner side surface IP of the second electrode E2 may have the plurality of concave-convex portions CV. Referring to FIG. 10, the second electrode E2 may be disposed in the second light emitting area EA2. The concave-convex portions CV on the inner side surface IP of the second electrode E2 may be in contact with the signal transmission area STA. The second opening OP2 may have a size greater than a size of the first opening OP1 when viewed in a plane. The second opening OP2 may be greater than the first opening OP1 depending on an amount of the laser beam irradiated to the second electrode E2.

In one embodiment, an upper surface TP of the second electrode E2 may be flat, and the inner side surface IP of the second electrode E2 extending from the upper surface TP to the signal transmission area STA may include the concave-convex portions CV when viewed in a cross-section. For example, the inner side surface IP may have an inclined surface extending from the upper surface TP and inclined toward the signal transmission area STA.

In one embodiment, the inner side surface IP of the second electrode E2 may correspond to an outer line of the second opening OP2 when viewed in a plane. The outer line of the second opening OP2 may include curved lines that are convex outwardly from the second opening OP2. Each of the concave-convex portions CV may include a curved line that is concave toward the second electrode E2. The curved line may have a size that varies depending on a spot size of the laser beam irradiated to the second electrode E2 and overlapping the signal transmission area STA.

Figure 11A:
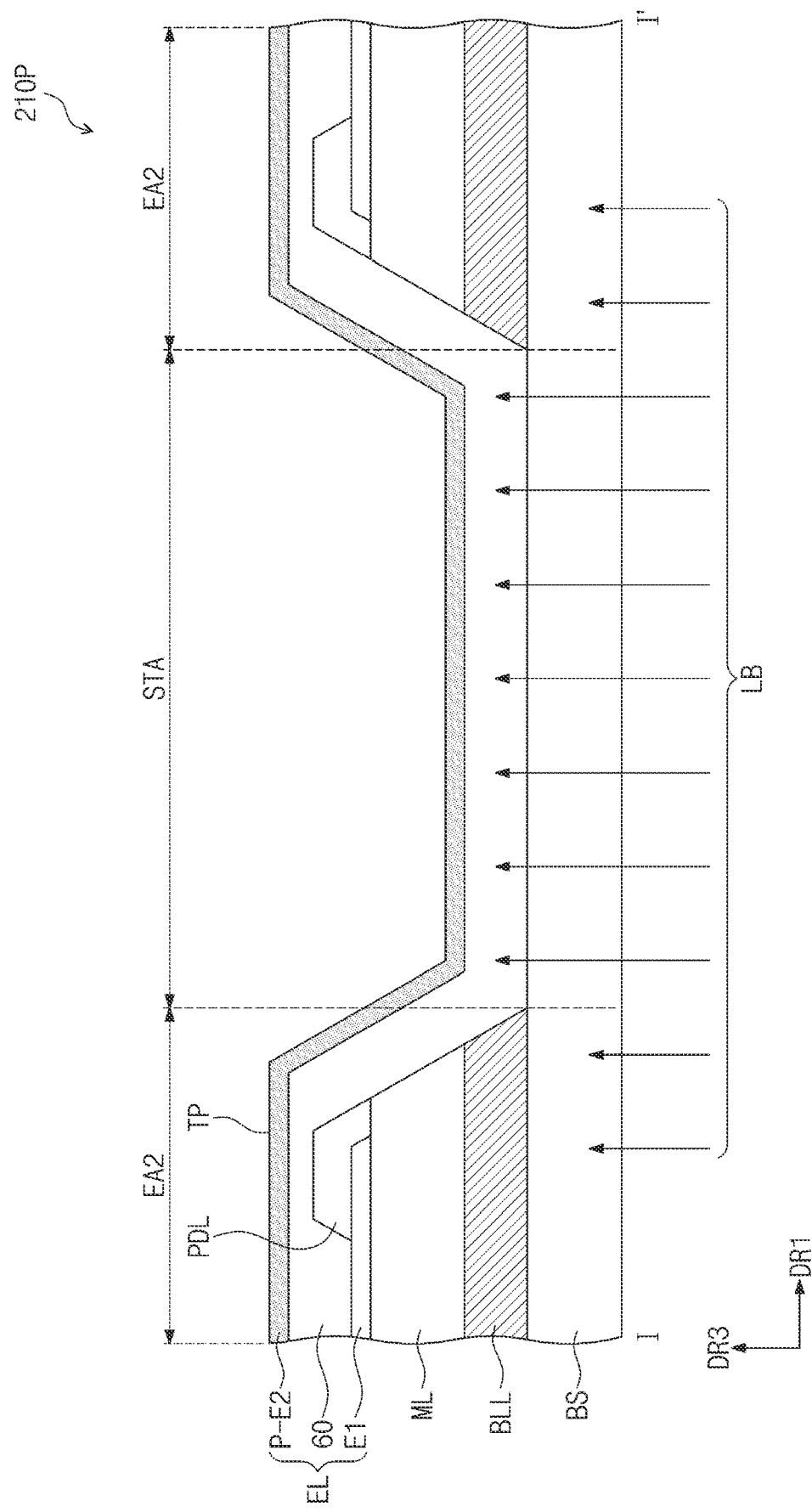
FIGS. 11A and 11B are cross-sectional views illustrating a method of manufacturing a display panel according to one embodiment of the present disclosure.
Figure 11B:
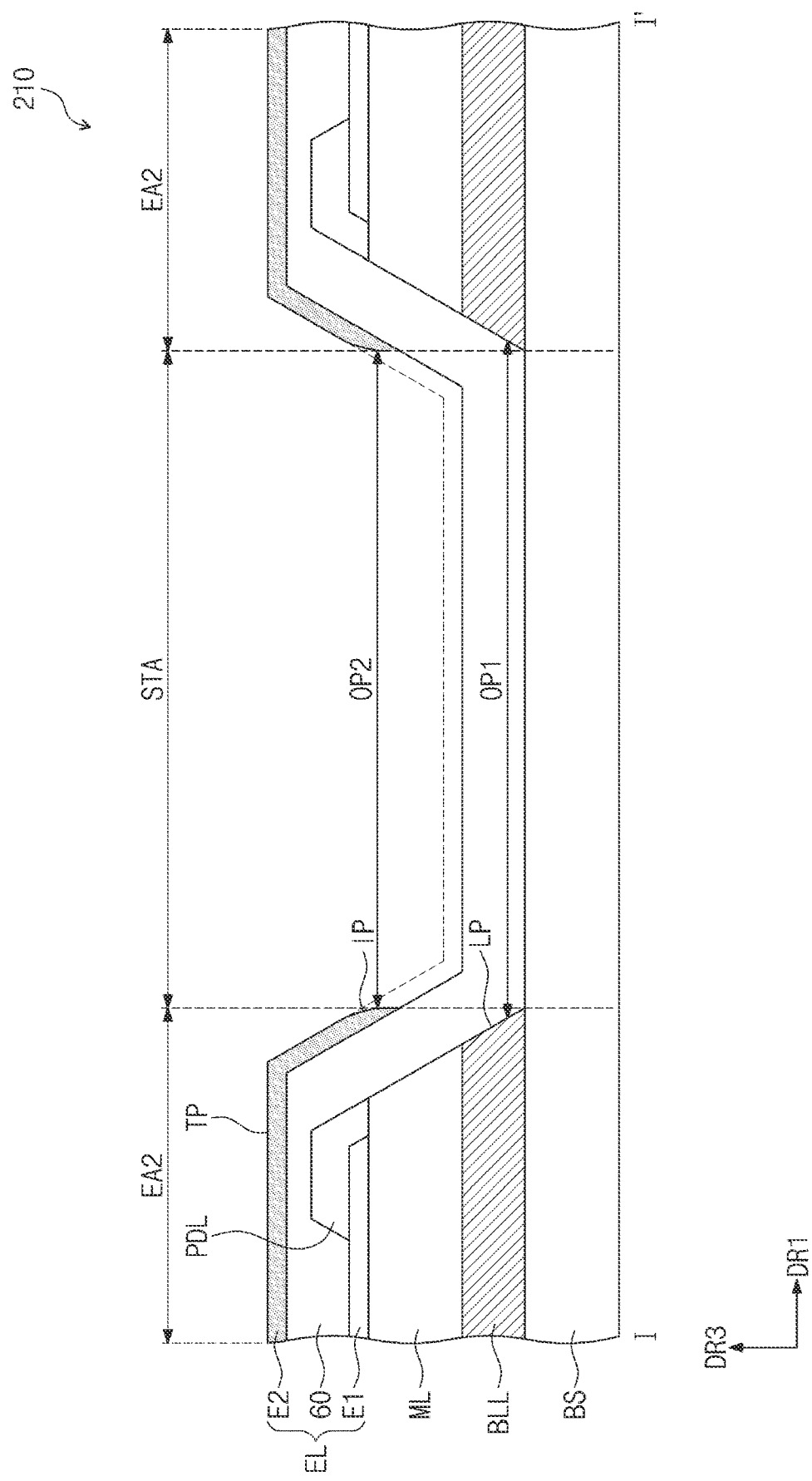

FIGS. 11A and 11B are cross-sectional views illustrating a method of manufacturing a display panel according to one embodiment of the present disclosure.

Referring to FIG. 11A, a preliminary display panel 210P and irradiating a laser beam LB are shown.

The preliminary display panel 210P may include a preliminary second electrode P-E2. The preliminary second electrode P-E2 may overlap the first light emitting areas EA1, the second light emitting areas EA2, and the signal transmission area STA. The preliminary second electrode P-E2 may include a metal material and may be transparent. The preliminary second electrode P-E2 may be disposed on the light emitting layer 60.

The laser beam LB may be irradiated to the signal transmission area STA from a lower side of the preliminary display panel 210P. The laser beam LB may be irradiated to the preliminary second electrode P-E2 through the base substrate BS and through the light emitting layer 60 via the first opening OP1. In one embodiment, the circuit element layer ML and the light emitting element layer EL may have the transmittance of about 95% or higher with respect to the laser beam LB. The laser beam LB may be an infrared laser (IR-laser) beam. In one embodiment, the laser beam LB may be irradiated not only to the signal transmission area STA but also to some of the second light emitting areas EA2 that are adjacent to the signal transmission area STA. The laser beam LB irradiated to some of the second light emitting areas EA2 may be absorbed or reflected by the light blocking pattern BLL preventing irradiation to the preliminary second electrode P-E2 in the second light emitting areas EA2. Some portions of the preliminary second electrode P-E2, that overlap the signal transmission area STA may be removed by the laser beam LB, and the second opening OP2 may be formed.

According to the present embodiment, the display panel 210 may include the light blocking pattern BLL, and the irradiation area of the laser beam LB irradiated to the signal transmission area STA may expand to some areas of the second light emitting areas EA2 adjacent to the signal transmission area STA. In this case, the irradiation area of the laser beam LB irradiated to the preliminary second electrode P-E2 may be expanded. Accordingly, a phenomenon in which the second electrode E2 overlaps a portion of the signal transmission area STA due to an alignment tolerance may be prevented in a patterning process of the second electrode E2. The light blocking pattern BLL may prevent irradiation of the laser beam LB to the circuit element layer ML and the light emitting element layer EL that are disposed in some areas of the second light emitting areas EA2.

Referring to FIG. 11B, the second electrode E2 may be formed by removing a portion of the preliminary second electrode P-E2 shown in FIG. 11A in the signal transmission area STA. The second electrode E2 may have the second opening OP2 corresponding to the signal transmission area STA. The second opening OP2 may correspond to the first opening OP1 that is formed through the light blocking pattern BLL.

Figure 12:
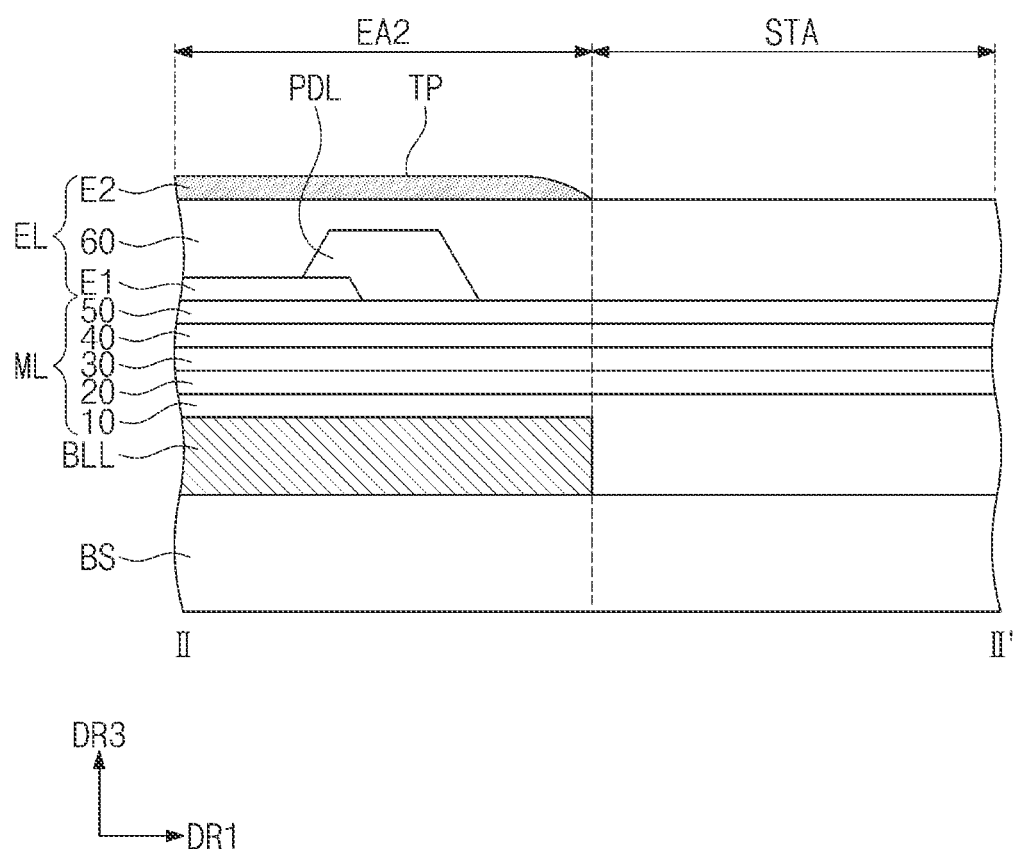
FIG. 12 is a cross-sectional view of a display panel according to another embodiment of the present disclosure.
Figure 13A:
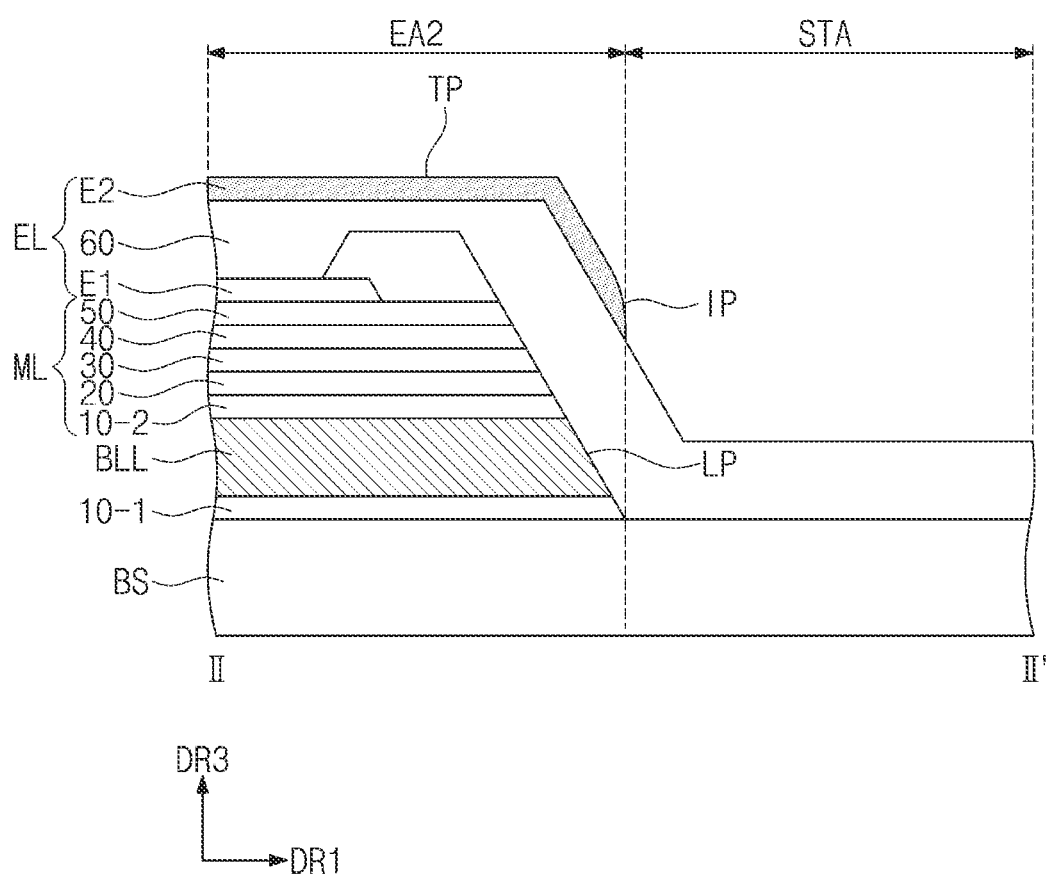
FIGS. 13A and 13B are cross-sectional views of a display panel according to other embodiments of the present disclosure.
Figure 13B:
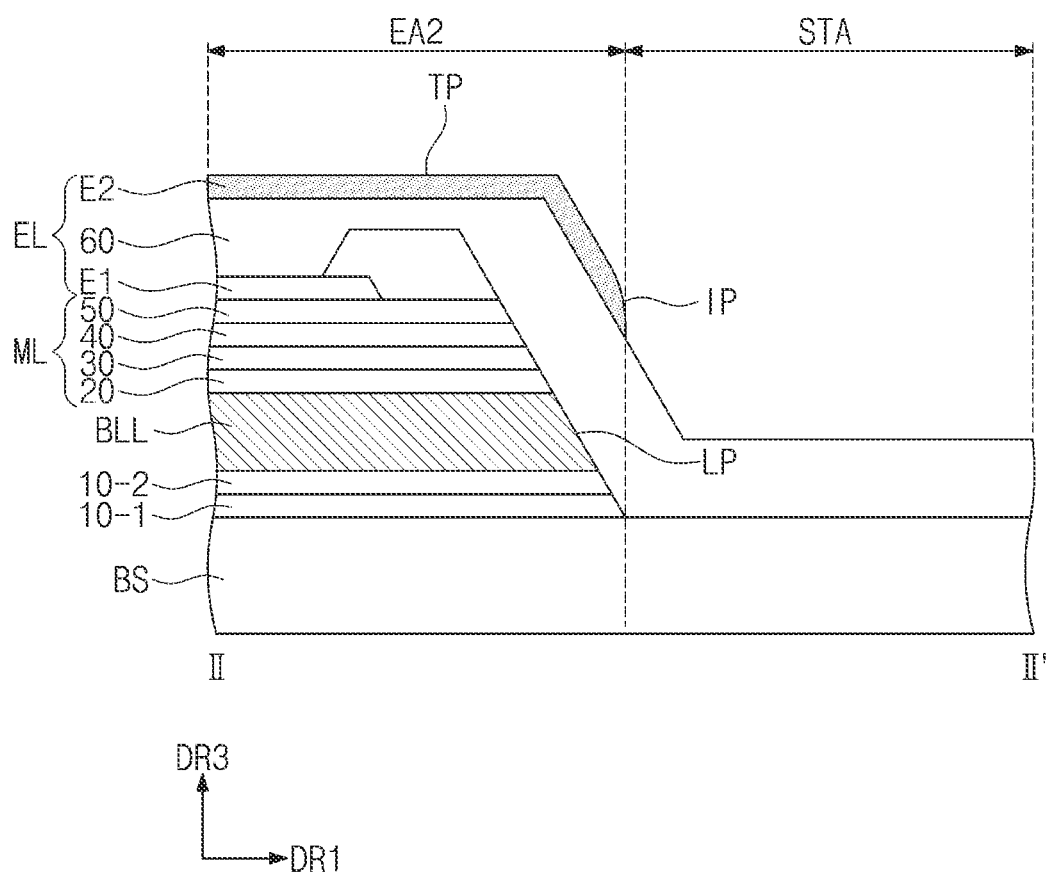

FIG. 12 is a cross-sectional view of a display panel according to another embodiment of the present disclosure. FIGS. 13A and 13B are cross-sectional views of a display panel according to other embodiments of the present disclosure.

Referring to FIG. 12, the circuit element layer ML may overlap the signal transmission area STA. That is, the circuit element layer ML may overlap the light emitting element layer EL and may be disposed entirely in the first display area DA1 and the second display area DA2. The circuit element layer ML may include an organic layer and/or an inorganic layer having the transmittance of about 95% or higher with respect to the infrared laser. The first to fifth insulating layers 10 to 50 may include an organic layer or an inorganic layer having a light transmissivity.

Referring to FIG. 13A, the light blocking pattern BLL may be disposed between a first inorganic layer 10-1 and a second inorganic layer 10-2. The first inorganic layer 10-1 may be disposed on the base substrate BS. The first inorganic layer 10-1 may include a barrier layer formed of an inorganic material. The second inorganic layer 10-2 may be disposed on the light blocking pattern BLL. The second inorganic layer 10-2 may include a buffer layer formed of an inorganic material. The first inorganic layer 10-1 may be disposed under the light blocking pattern BLL, and the second inorganic layer 10-2 may be disposed on the light blocking pattern BLL.

Referring to FIG. 13B, the first inorganic layer 10-1 and the second inorganic layer 10-2 may be disposed on the base substrate BS. The first inorganic layer 10-1 may be disposed on the base substrate BS, and the second inorganic layer 10-2 may be disposed on the first inorganic layer 10-1. Each of the first inorganic layer 10-1 and the second inorganic layer 10-2 may correspond to either a barrier layer or a buffer layer. The light blocking pattern BLL may be disposed on the second inorganic layer 10-2. For example, the light blocking pattern BLL may be disposed on the barrier layer or the buffer layer. In the present embodiment, the base substrate BS may include a polyimide layer and an inorganic layer. The first inorganic layer 10-1 and the second inorganic layer 10-2 may be disposed on the base substrate BS.

Although some example embodiments of the present disclosure have been described, it is understood that the present disclosure should not be limited to these example embodiments, and various changes and modifications can be made by one ordinary skilled in the art within the scope of the present disclosure as hereinafter claimed. Therefore, the disclosed subject matter should not be limited to any particular embodiment described herein, and the scope of the present inventive concept shall be determined based on the entirety of the present disclosure as represented by the attached claims.

What is claimed is:

1. A display panel comprising:
    a first display area comprising a plurality of first light emitting areas;
    a second display area adjacent to the first display area in a plan view of the display panel and comprising a plurality of second light emitting areas and a signal transmission area adjacent to the plurality of second light emitting areas in the plan view of the display panel, wherein the plurality of second light emitting areas in the second display area has a first transmittance, and the signal transmission area in the second display area has a second transmittance that is higher than the first transmittance of the plurality of second light emitting areas;
    a base substrate;
    a circuit element layer disposed on the base substrate;
    a light blocking pattern disposed between the base substrate and the circuit element layer, overlapping the plurality of first light emitting areas and the plurality of second light emitting areas, and having a first opening corresponding to the signal transmission area; and
    a light emitting element layer disposed on the circuit element layer and comprising:
    a first electrode overlapping the plurality of first light emitting areas and the plurality of second light emitting areas;
    a light emitting layer disposed on the first electrode and corresponding to at least the plurality of second light emitting areas; and
    a second electrode overlapping the plurality of first light emitting areas and the plurality of second light emitting areas.

2. The display panel of claim 1, wherein the second electrode has a second opening corresponding to the signal transmission area, and an inner side surface of the second electrode that faces the second opening comprises a plurality of concave-convex portions.

3. The display panel of claim 2, wherein the inner side surface of the second electrode faces an outer line of the second opening when viewed in the plan view of the display panel, and the outer line comprises curved lines that are convex outwardly from the second opening.

4. The display panel of claim 2, wherein the first opening and the second opening are substantially aligned with each other in a cross-section.

5. The display panel of claim 1, further comprising a first inorganic layer disposed between the base substrate and the circuit element layer, wherein the light blocking pattern is disposed on or under the first inorganic layer.

6. The display panel of claim 5, further comprising a second inorganic layer disposed between the base substrate and the first inorganic layer, wherein the light blocking pattern is disposed between the first inorganic layer and the second inorganic layer.

7. The display panel of claim 1, wherein the signal transmission area is provided in plural, and the plurality of second light emitting areas is alternately arranged with a plurality of the signal transmission areas.

8. The display panel of claim 1, wherein each of the plurality of first light emitting areas and the plurality of second light emitting areas comprises a plurality of sub-light emitting areas, and each of the sub-light emitting areas comprises at least one of a first color light emitting area, a second color light emitting area, and a third color light emitting area.

9. The display panel of claim 1, wherein a second light emitting area of the plurality of second light emitting areas has substantially a same size as a size of the signal transmission area that is adjacent to the second light emitting area.

10. The display panel of claim 1, wherein the light blocking pattern comprises a metal layer, and the metal layer absorbs or reflects an infrared laser incident to the metal layer.

11. The display panel of claim 1, wherein the second light emitting areas transmit about 95% or higher of an infrared laser.

12. The display panel of claim 1, wherein the light blocking pattern has a first thickness greater than a second thickness of the second electrode.

13. The display panel of claim 12, wherein the first thickness of the light blocking pattern is in a first range from about 100 nm to about 500 nm, and the second thickness of the second electrode is in a second range from about 5 nm to about 20 nm.

14. A method of manufacturing a display panel comprising:
providing a preliminary display panel comprising a first display area comprising a plurality of first light emitting areas and a second display area adjacent to the first display area and comprising a plurality of second light emitting areas and a signal transmission area adjacent to the plurality of second light emitting areas, wherein the plurality of second light emitting areas in the second display area has a first transmittance, and the signal transmission area in the second display area has a second transmittance that is higher than the first transmittance of the plurality of second light emitting areas; and
irradiating a laser beam to the signal transmission area from a lower side of the preliminary display panel, the preliminary display panel comprising:
a base substrate;
a circuit element layer disposed on the base substrate;
a light blocking pattern disposed between the base substrate and the circuit element layer, overlapping the plurality of first light emitting areas and the plurality of second light emitting areas, and having a first opening corresponding to the signal transmission area; and
a light emitting element layer disposed on the circuit element layer and comprising:
a first electrode overlapping the plurality of first light emitting areas and the plurality of second light emitting areas;
a light emitting layer disposed on the first electrode; and
a preliminary second electrode overlapping the plurality of first light emitting areas, the plurality of second light emitting areas, and the signal transmission area.

15. The method of claim 14, wherein the base substrate, the circuit element layer, and the light emitting layer transmit about 95% or higher of the laser beam.

16. The method of claim 14, wherein the irradiating of the laser beam comprises irradiating an infrared laser to the preliminary second electrode.

17. The method of claim 14, wherein the irradiating of the laser beam comprises irradiating the laser beam to a portion of the plurality of second light emitting areas adjacent to the signal transmission area.

18. The method of claim 14, wherein the light blocking pattern comprises a metal layer that absorbs or reflects the laser beam.

19. The method of claim 14, wherein the irradiating of the laser beam comprises removing a portion of the preliminary second electrode that corresponds to the signal transmission area.

20. A display device comprising:
a display panel comprising a first display area and a second display area adjacent to the first display area in a plan view of the display device and comprising a light emitting area and a signal transmission area adjacent to the light emitting area in the plan view of the display device, wherein the first display area has a first transmittance, and the second display area has a second transmittance that is higher than the first transmittance, and wherein the light emitting area has a third transmittance, and the signal transmission area has a fourth transmittance that is higher than the third transmittance; and
an electronic module disposed under the display panel and overlapping the second display area, the display panel comprising:
a base substrate;
a circuit element layer disposed on the base substrate;
a light blocking pattern disposed between the base substrate and the circuit element layer, overlapping the first display area and the light emitting area and having a first opening corresponding to the signal transmission area; and
a light emitting element layer disposed on the circuit element layer and comprising:
a first electrode overlapping the first display area and the light emitting area;
a light emitting layer disposed on the first electrode and corresponding to at least the light emitting area; and
a second electrode overlapping the first display area and the light emitting area.

21. The display device of claim 20, wherein the electronic module is provided in plural and a plurality of the electronic modules include a camera and a sensor.

22. The display device of claim 20, wherein the second electrode has a second opening corresponding to the signal transmission area, and an inner side surface of the second electrode that faces the second opening comprises a plurality of concave-convex portions.

23. The display device of claim 20, wherein the second transmittance corresponds to an average of the third transmittance of the light emitting area and the fourth transmittance of the signal transmission area.

* * * * *